(12) United States Patent
Shirota

(10) Patent No.: US 12,250,816 B2
(45) Date of Patent: Mar. 11, 2025

(54) NAND FLASH MEMORY AND MANUFACTURING METHOD THEREOF

(71) Applicant: Winbond Electronics Corp., Taichung (TW)

(72) Inventor: Riichiro Shirota, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 413 days.

(21) Appl. No.: 17/489,826

(22) Filed: Sep. 30, 2021

(65) Prior Publication Data

US 2022/0115400 A1    Apr. 14, 2022

(30) Foreign Application Priority Data

Oct. 9, 2020 (JP) ................. 2020-170882

(51) Int. Cl.
*H10B 43/20* (2023.01)
*H10B 41/35* (2023.01)
(Continued)

(52) U.S. Cl.
CPC ............. *H10B 43/27* (2023.02); *H10B 41/35* (2023.02); *H10B 43/10* (2023.02); *H10B 43/20* (2023.02); *H10B 43/35* (2023.02); *H10B 43/30* (2023.02)

(58) Field of Classification Search
CPC ........ H10B 41/30; H10B 41/35; H10B 43/30; H10B 43/35; H01L 29/42324;
(Continued)

(56) References Cited

U.S. PATENT DOCUMENTS 10,418,369 B2 * 9/2019 Or-Bach ................ H10B 12/20
11,296,106 B2 * 4/2022 Or-Bach ................ H10B 43/20
(Continued)

FOREIGN PATENT DOCUMENTS

CN      105762151      7/2016
KR      20080027162    3/2008
(Continued)

OTHER PUBLICATIONS

Translation of Kiyotoshi, KR 20080027162 A, 2008 (Year: 2008).*
(Continued)

*Primary Examiner* — Nicholas J Tobergte
*Assistant Examiner* — William Henry Anderson
(74) *Attorney, Agent, or Firm* — JCIPRNET

(57) ABSTRACT

A NAND flash memory and manufacturing method thereof are provided. The NAND flash memory is capable of preventing a short circuit between gates extending along a vertical direction. The NAND flash memory includes a substrate; a plurality of channel stacks formed on the substrate and extending along an X direction; an interlayer dielectric formed between the channel stacks; a plurality of trenches formed apart from each other in the interlayer dielectric and arranged along a Y direction; an insulator stack including a charge storage layer formed to cover sidewalls of each of the trenches; and a plurality of conductive vertical gates elongating along the vertical direction in a space formed by the insulator stack in each of the trenches and extending along the Y direction.

9 Claims, 14 Drawing Sheets

(51) Int. Cl.
 *H10B 43/10* (2023.01)
 *H10B 43/27* (2023.01)
 *H10B 43/35* (2023.01)
 *H10B 43/30* (2023.01)
(58) Field of Classification Search
 CPC ......... H01L 29/42328; H01L 29/42332; H01L 29/42336; H01L 29/4234; H01L 29/42344; H01L 29/42348; H01L 29/42352
 See application file for complete search history.

(56) References Cited

U.S. PATENT DOCUMENTS

| | | | | |
|---|---|---|---|---|
| 2011/0284946 | A1* | 11/2011 | Kiyotoshi | H10B 41/35 257/E21.09 |
| 2014/0264546 | A1* | 9/2014 | Lai | H01L 29/66833 257/774 |
| 2017/0323896 | A1* | 11/2017 | Hu | H01L 29/40114 |
| 2018/0269229 | A1* | 9/2018 | Or-Bach | H01L 29/0673 |
| 2019/0319033 | A1 | 10/2019 | Lee et al. | |

FOREIGN PATENT DOCUMENTS

| | | | | |
|---|---|---|---|---|
| KR | 20080027162 A | * | 3/2008 | ............ H10B 43/30 |
| KR | 20100116198 | | 10/2010 | |
| TW | 201644035 | | 12/2016 | |

OTHER PUBLICATIONS

Wonjoo Kim, et al., "Multi-layered Vertical Gate NAND Flash Overcoming Stacking Limit for Terabit Density Storage", 2009 Symposium on VLSI Technology Digest of Technical Papers, Jun. 2009, pp. 188-189.

"Office Action of Korea Counterpart Application", with English translation thereof, issued on Jun. 17, 2023, p. 1-p. 7.

* cited by examiner (1) formation of WL, BL, and CSL (2) deposit of multi-active layers with ion implants and active patterning (3) charge trap layer deposited over patterned active (4) formation of vertical gate (5) formation of vertical plugs cross section taken along A1-A1 line cross section taken along A2-A2 line cross section taken along B-B line cross section taken along A1-A1 line cross section taken along A1-A1 line

NAND FLASH MEMORY AND MANUFACTURING METHOD THEREOF

CROSS-REFERENCE TO RELATED APPLICATION

This application claims the priority benefit of Japanese application serial no. 2020-170882, filed on Oct. 9, 2020. The entirety of the above-mentioned patent application is hereby incorporated by reference herein and made a part of this specification.

BACKGROUND

Technical Field

The disclosure relates to a NAND flash memory, and particularly relates to a NAND flash memory with a three-dimensional structure.

Description of Related Art

In recent years, to achieve an improvement in the degree of integration of memory cells, a NAND flash memory with a three-dimensional structure in which an array of memory cells is stacked in a direction perpendicular and opposite to the surface of the substrate has been put into practical use. A three-dimensional NAND flash memory using a vertical gate structure has been proposed by Non-Patent Document 1. FIG. 1A is a perspective view illustrating the three-dimensional structure of the memory cell array, and FIG. 1B is a plan view thereof. FIG. 2 is an equivalent circuit of the memory cell array of FIG. 1A.

At the bottom of the memory cell array, a plurality of bit lines BL extending horizontally in the row direction are formed, and in the column direction orthogonal thereto, a plurality of word lines WL, a plurality of selection gate lines SSL and GSL and common source lines CSL are formed extending in the horizontal direction. A plurality of long strips of multi active layers are formed on the bit lines BL, word lines WL, selection gate lines SSL, and selection gate lines GSL. A multi active layer is a stacked structure of active regions of multiple polysilicon layers and an interlayer dielectric (ILD) formed between each of the multiple active regions, and each multi active layer extends in the row direction. In the space between the multi active layers, a plurality of vertical gates separated in the row direction are formed. Each of the plurality of vertical gates is allocated from the word line WL, the selection gate line SSL, and the selection gate line GSL. Moreover, the bit line vertically allocated from the bit line BL is connected to an end on one side of the multi active layers, and the source line allocated vertically from the common source line CSL is connected to an end on another side of the multi active layers. An active region in the horizontal direction of the multi active layers provides a channel for a NAND string.

Second conductive plug in a contact hole from an upper memory cell array of FIG. 1A. In first step (1), the bit line BL extending in the row direction are formed on the substrate. The word line WL, the selection gate line SSL, GSL, and the common source line CSL extending in the column direction are formed on the substrate. However, the processes can be changed to subsequent steps. In the step (2), the laminate of the polysilicon layer and the interlayer dielectric is deposited on the substrate, and the laminate is etched to form long multi active layers extending in the row direction. In the step (3), a laminate of insulators is deposited in the space between the multi active layers. The laminate of the insulators includes at least three layers, and the center is a layer for storing electric charges. In the step (4), a low-resistance gate material is deposited in the space of the multi active layer laminated with insulators. Therefore, the space of the multi active layer is filled with the laminate of the insulators and the gate material. Furthermore, the gate material is patterned to form a plurality of vertical gates separated in the row direction. In the step (5), vertical plugs respectively connected to the bit line BL and the common source line CSL are formed.

PRIOR ART LITERATURE

Non-Patent Literature

[Non-Patent Document 1] Multi-Layered Vertical Gate NAND Flash Overcoming Stacking Limit for Terabit Density Storage, wonjoo Kim et al., symposium on VLSI Technology Digest of Technical Papers, P 188-189.

SUMMARY

The three-dimensional NAND flash memory with the vertical gate structure shown in FIG. 1A to FIG. 3 has the following problems. FIG. 4A is a perspective view illustrating a schematic structure of a vertical gate and a multi active layer, and FIG. 4B is a cross-sectional view taken along line A-A of FIG. 4A. The strip patterning of multi active layers 10 including polysilicon layers 12 and interlayer dielectrics 14 is performed by anisotropic dry etching, for example. The polysilicon layer 12 provides a channel, and the interlayer dielectric 14 provides insulation function between the laminated polysilicon layers 12. The etched surface in the vertical direction of the patterned multi active layer 10 may not be linear. For example, if the horizontal etching speed of the interlayer dielectric 14 of the multi active layers 10 is faster than that of the polysilicon layer 12, the etched surface of the interlayer dielectric 14 subsides to be slightly lower than the etched surface of the polysilicon layer 12. After the patterning of the multi active layers 10, an insulator 22 including the charge storage layer is fully deposited, next the gate material is fully deposited, and then the gate material is patterned to form a vertical gate 20. The patterning of the gate material is performed by anisotropic dry etching. However, as shown in FIG. 4B, if there are depressions on the etched surface of the multi active layer 10, the film thickness of the gate material may not be uniform and it is difficult to accurately etch the vertical gate. Moreover, if etching is performed for a time corresponding to the thick portion of the gate material, the interlayer dielectric 14 of the multi active layer 10 is further over-etched in the horizontal direction, and there is a concern of poor insulation or a short circuit between the vertical gates 20 on opposite sides of the multi active layer 10. Furthermore, the deterioration of the etching accuracy of the vertical gate 20 may cause a short circuit between the adjacent vertical gates 20 in the extending direction (the direction orthogonal to line A-A) of the multi active layer 10.

The purpose of the disclosure is to solve such a conventional problem and provide a NAND flash memory and a manufacturing method thereof capable of preventing a short circuit between gates extending along the vertical direction.

The manufacturing method of the NAND flash memory of the disclosure includes steps as follows. In a step, multiple channel stacks including a first interlayer dielectric and a channel layer alternately stacked are formed on a substrate.

The channel stacks include a first side surface and a second side surface opposite to the first side surface, and the first side surface and the second side surface extend along a first direction. In a step, a second interlayer dielectric is formed between the first side surface and the second side surface of each of the multiple channel stacks. In a step, multiple trenches are formed at a fixed pitch in a first direction of the second interlayer dielectric. In a step, an insulator including a charge storage layer is formed so as to cover at least inner walls of each trench. In a step, multiple gates extending along a second direction are formed so as to fill a space in each trench in the second direction orthogonal to the first direction.

The NAND flash memory of the disclosure includes a substrate, multiple channel stacks, an interlayer dielectric, multiple trenches, an insulator, and multiple gates. The channel stacks are formed on the substrate. The channel stacks have a first side surface and a second side surface opposite to the first side surface, and the first side surface and the second side surface extend along the first direction. The interlayer dielectric is formed between the first side surface and the second side surface of each adjacent channel stack. The trenches are formed at a fixed pitch in the first direction of the interlayer dielectric. The insulator including a charge storage layer is formed so as to cover at least sidewalls of each trench. The gates extend along the second direction so as to fill a space in each trench in the second direction orthogonal to the first direction.

According to the disclosure, the gate is formed in the space in the trench formed between the channel stacks, and therefore, it is possible to prevent a short circuit of the adjacent gate in the first direction and the second direction.

BRIEF DESCRIPTION OF THE DRAWINGS

FIG. 4A is a perspective view illustrating the connection relationship between the vertical gate and the multi active layer. FIG. 4B is a cross-sectional view taken along line A-A of FIG. 4A.

DESCRIPTION OF THE EMBODIMENTS

Figure 1A:
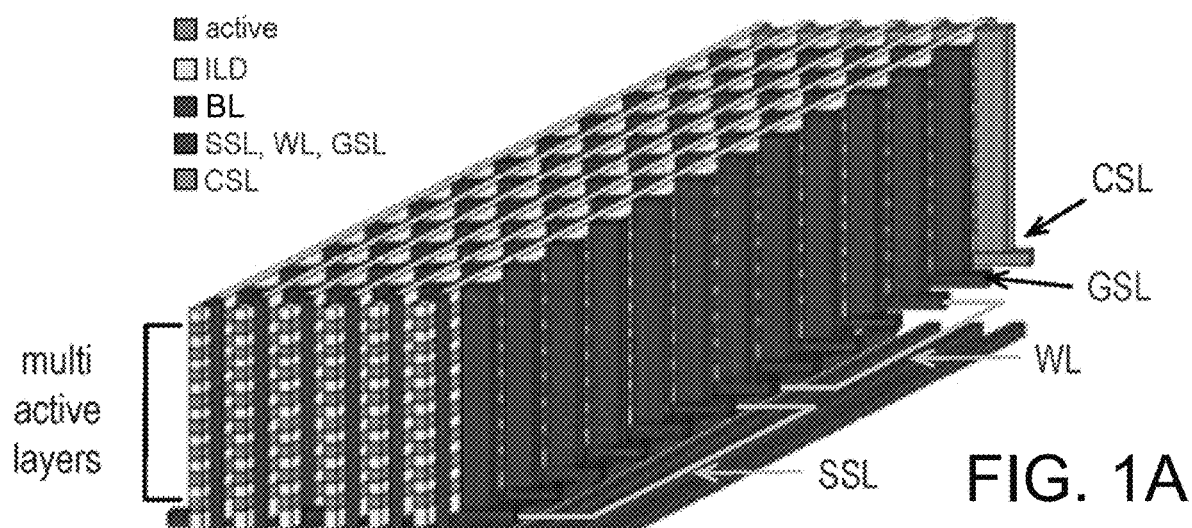
FIG. 1A is a perspective view illustrating the three-dimensional structure of the memory cell array.
Figure 1B:
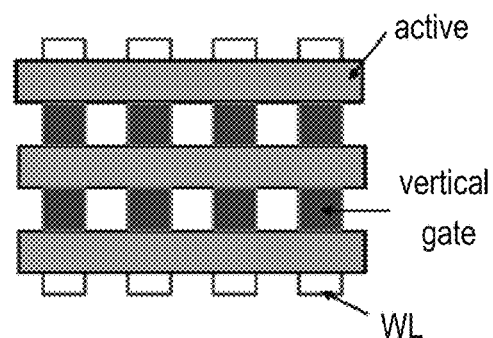
FIG. 1B is a plan view thereof.
Figure 2:
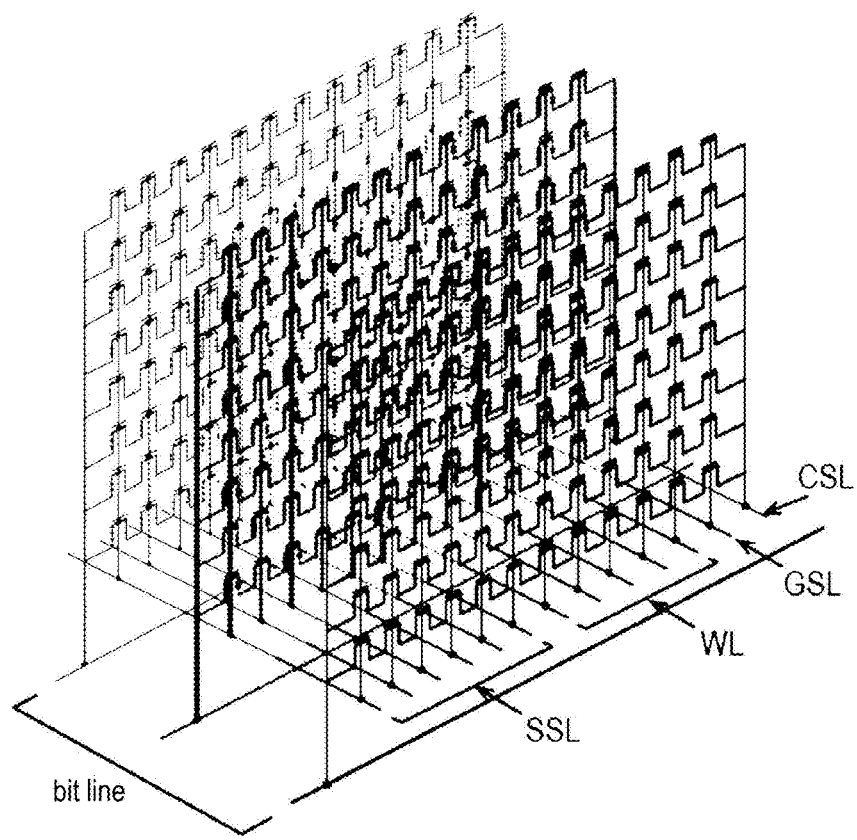
FIG. 2 is an equivalent circuit of the memory cell array of FIG. 1A.
Figure 3:
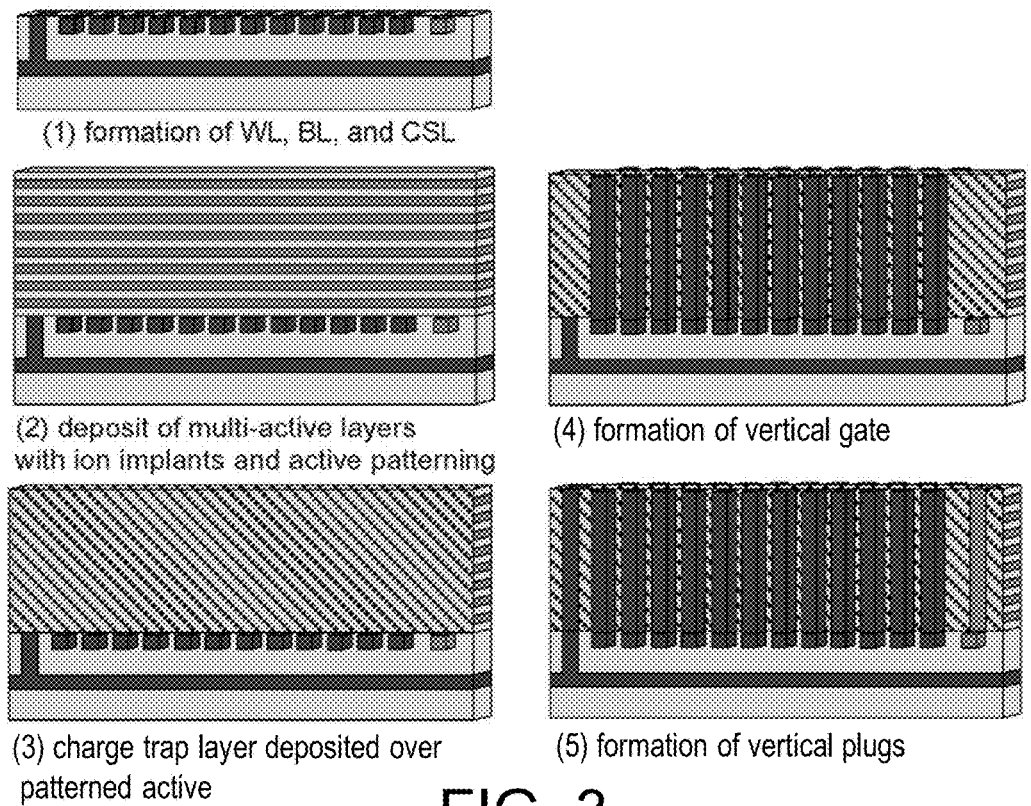
FIG. 3 is a schematic cross-sectional view illustrating the manufacturing process of the memory cell array shown in FIG. 1A.
Figure 4A:
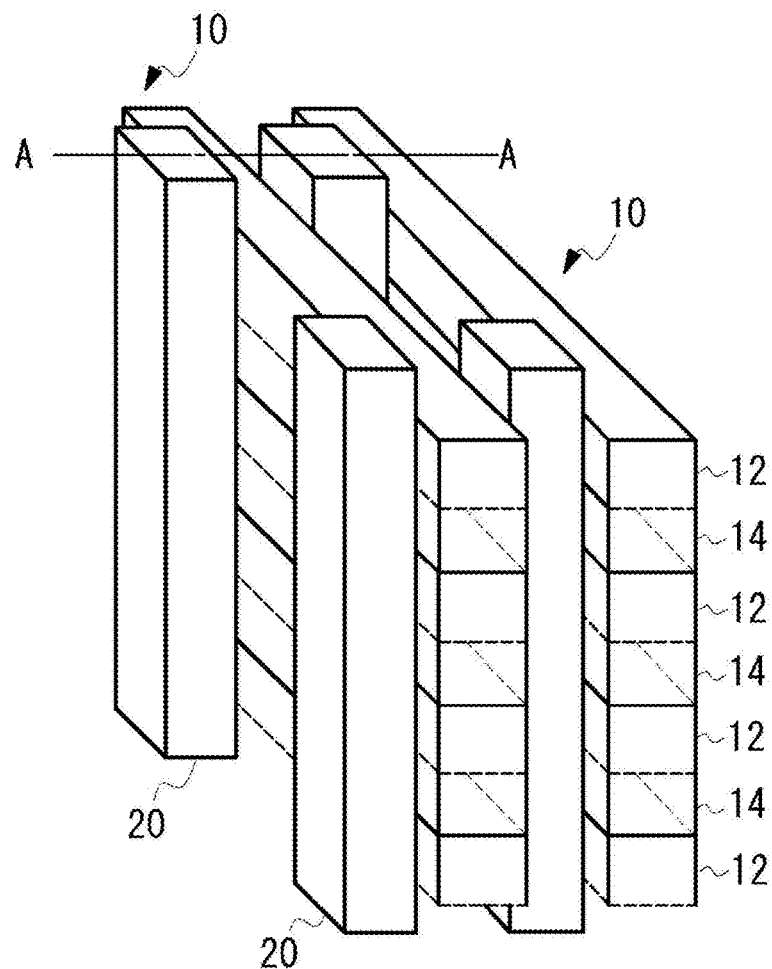
FIG. 4A and FIG. 4B are views illustrating the problems of the conventional three-dimensional structure of the flash memory.
Figure 4B:
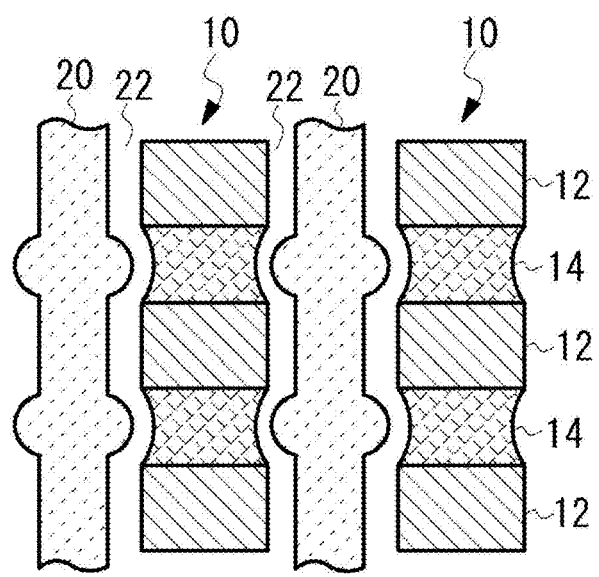

The NAND flash memory with the three-dimensional structure of the disclosure is used as a storage medium for various semiconductor devices (e.g., microcontrollers, microprocessors, logic devices, and the like embedded in such flash memory).

Next, embodiments of the disclosure are illustrated with reference to the drawings. The dimensions of the drawings are exaggerated in order to facilitate the understanding of the disclosure, and note that they do not necessarily indicate the dimensions of the actual product.

Referring to FIG. 5, FIG. 6A, FIG. 6B and FIG. 7, the NAND flash memory of the embodiment includes a substrate 100; a lower interlayer dielectric 110 formed on the substrate 100; a plurality of channel stacks 120 formed on the lower interlayer dielectric 110 and extending along the X direction; a plurality of vertical gates 130 extending in the vertical direction so as to cover the sides of the plurality of channel stacks 120 and extending in the Y direction on the plurality of channel stacks 120; a plurality of bit lines 150 electrically connected to one end of one side of each channel stack 120 and extending along the X direction; and a common source line 160 electrically connected to one end of another side of each channel stack 120 in a shared manner and extending along the Y direction.

The substrate 100 is not particularly limited and includes a silicon substrate, for example. The lower interlayer dielectric 110 is not particularly limited and includes silicon oxide or silicon nitride, for example.

One channel stack 120 has a first side surface S1 extending in a vertical direction from the substrate 100 and a second side surface S2 opposite to the first side surface S1, and the first side surface S1 and the second side surface S2 extend in the X direction. The channel stack 120 is fin-shaped or thin plate-shaped, and the planar shape of the channel stack 120 is rectangular or long strip-shaped when viewed from the Y direction. The channel stack 120 is a structure in which a polysilicon layer 122 and an interlayer dielectric 124 are alternately stacked to serve as channel layers and provide channel regions. A plurality of such channel stacks 120 are disposed at a fixed interval along the Y direction.

Figure 6A:
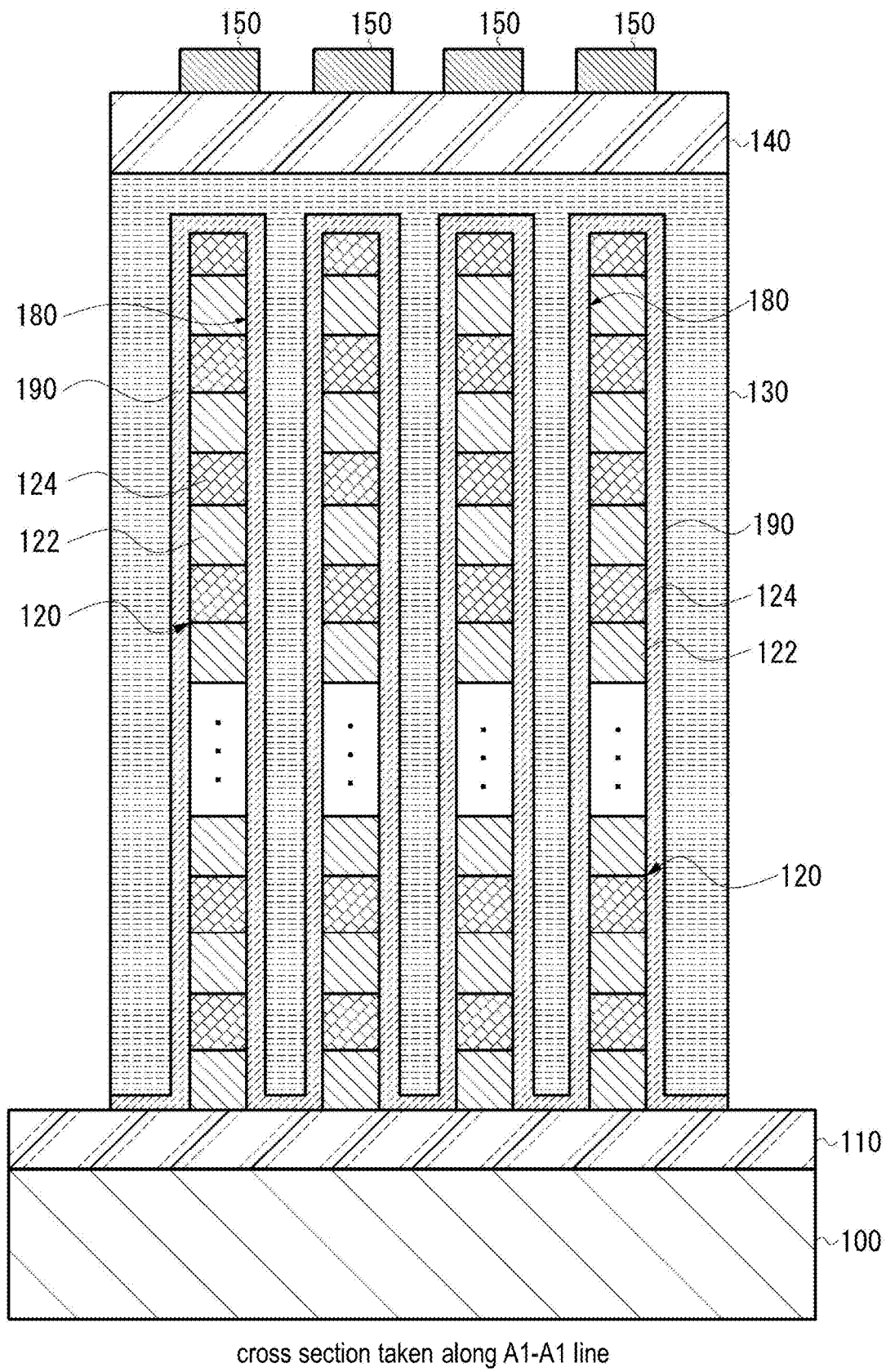
FIG. 6A is a cross-sectional view taken along line A1-A1 in FIG. 5.
Figure 6B:
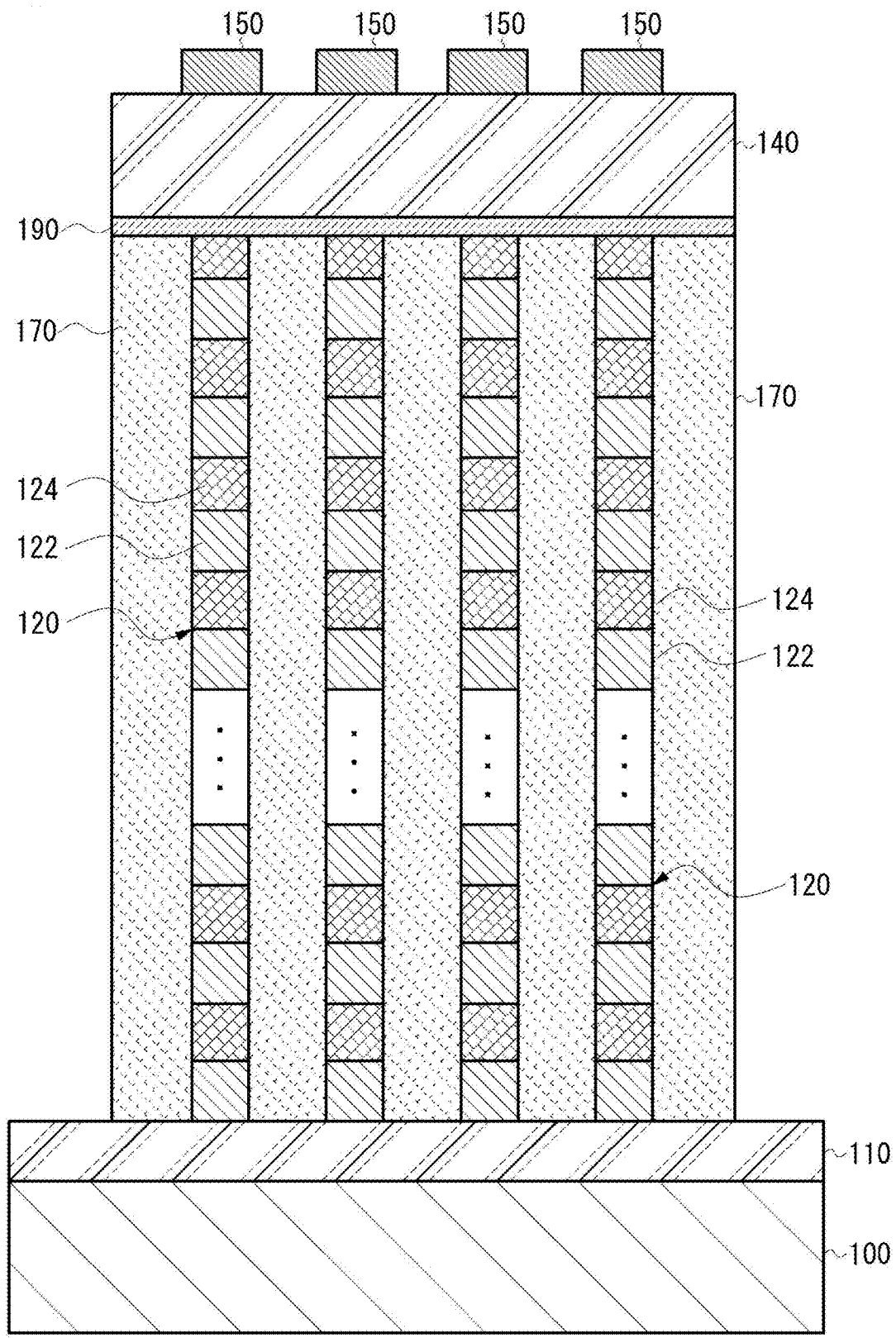
FIG. 6B is a cross-sectional view taken along line A2-A2 in FIG. 5.

An interlayer dielectric 170 is formed between the plurality of channel stacks 120, and a plurality of trenches 180 leading to the lower interlayer dielectric 110 are formed in the interlayer dielectric 170. That is, a plurality of the trench 180 are formed at a fixed pitch along the X direction of the interlayer dielectric 170 so as to expose the adjacent first side surface S1 and second side surface S2 of the channel stack 120. Therefore, each trench 180 is also arranged in the Y direction. In the example of FIG. 6A, the planar shape of one trench 180 is rectangular.

In each trench 180, an insulator stack 190 is formed so as to cover the bottom surface and the side surfaces of the trench 180. The insulator stack 190 covers the first side S1 and the second side S2 of the channel stack 120 exposed in the trench 180. The insulator stack 190 is a structure in which three or more interlayer dielectrics including a charge storage layer are laminated. For example, the insulator stack 190 includes an oxide layer/nitride layer/oxide layer (ONO), and the nitride layer accumulates charges at the interface with the oxide layer. Alternatively, the insulator stack 190 includes a conductive polysilicon layer in the center instead of the nitride layer, and charges are stored in the polysilicon layer. The charge accumulation layer can accumulate negative or positive charges generated by programming actions or erasing actions. The film thickness of the insulator stack 190 is less than the dimensions of the trench 180 in the X direction and the Y direction. After the insulator stack 190 is formed, a space surrounded by the insulator stack 190 is formed in the trench 180.

The plurality of vertical gates 130 are formed to cover the direction intersecting the plurality of channel stacks 120, that is, the Y-direction that the trench 180 is disposed. The vertical gate 130 fills the space left by the insulator stack 190 in the trench 180. Therefore, the vertical gate 130 separated from the insulator stack 190 extends in the vertical direction from the substrate in the trench 180 and elongates in the vertical direction on the first side S1 and the second side S2 of the channel stack 120. Each of the plurality of vertical gates 130 constitutes a plurality of bit line side selection transistors, a memory cell, and a selection gate line and word line of the source line side selection transistor of the NAND string.

Figure 5:
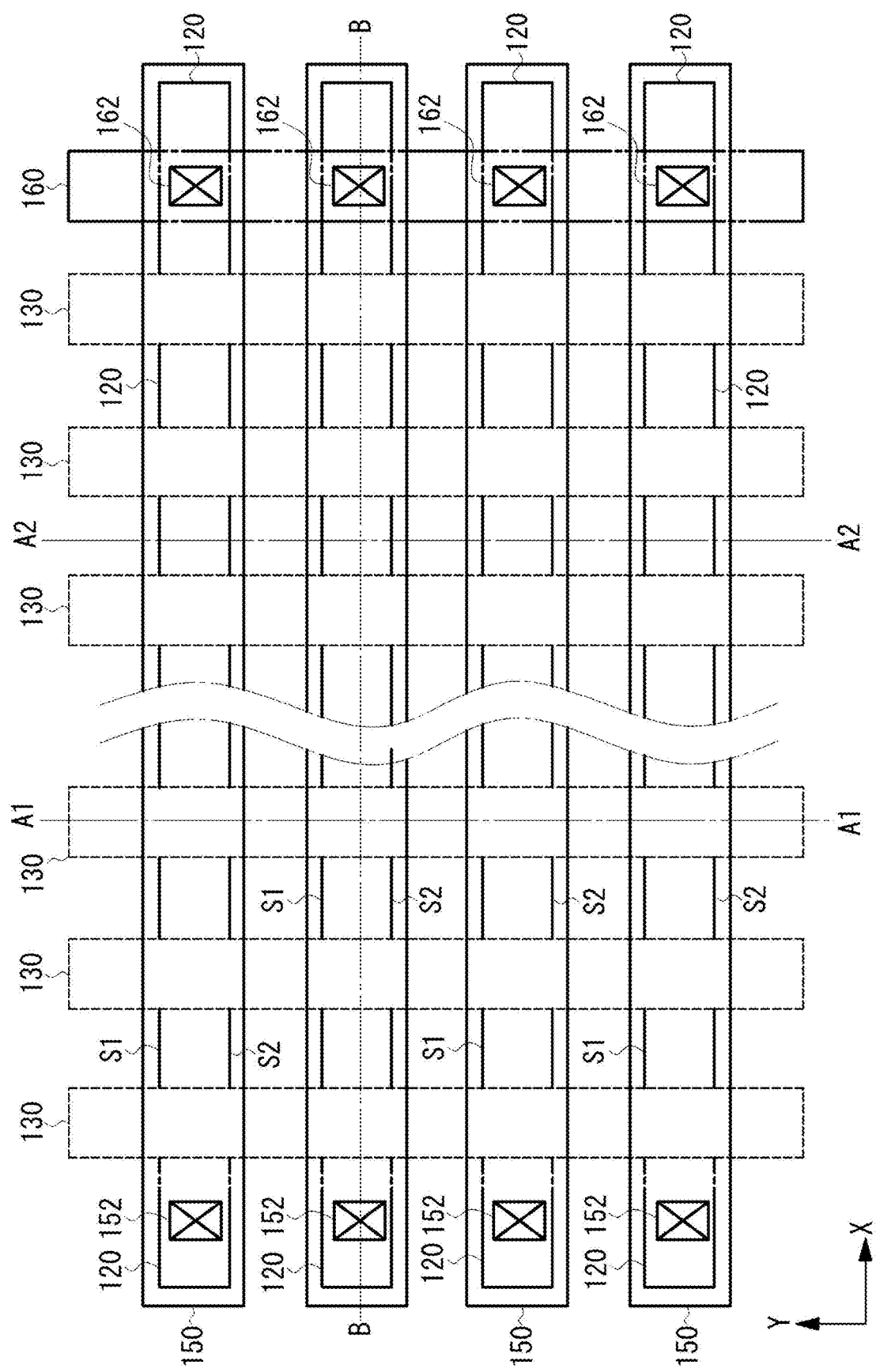
FIG. 5 is a plan view of a NAND flash memory with a three-dimensional structure according to an embodiment of the disclosure.
Figure 7:
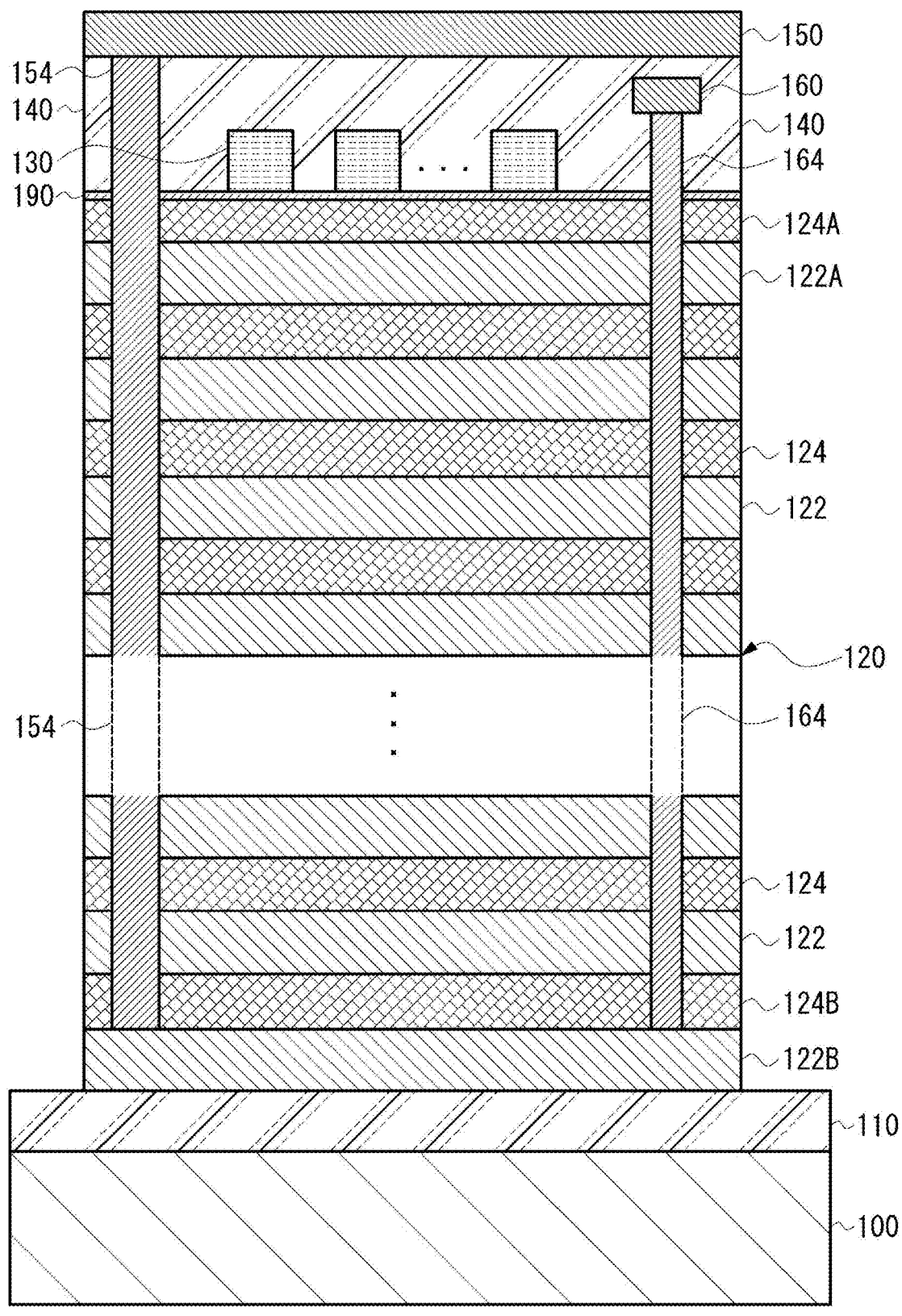
FIG. 7 is a cross-sectional view taken along line B-B in FIG. 5.

An interlayer insulating film 140 is formed on the plurality of channel stacks 120. On the interlayer insulating film 140, the common source line 160 extending in the Y direction is formed. For example, the common source line 160 includes a conductive material such as metal. At the position where the common source line 160 intersects each channel stack 120, as shown in FIG. 5 and FIG. 7, the interlayer insulating film 140, the insulator stack 190, and a contact hole 162 extending from an uppermost interlayer dielectric 124A of the channel stack 120 to a lowermost interlayer dielectric 124B are formed. The contact hole 162 is filled with a conductive plug 164. Therefore, the common source line 160 is electrically connected to the end of the another side of the channel stack 120 from the uppermost polysilicon layer 122A to the lowermost polysilicon layer 122B through the conductive plug 164 in a shared manner.

The interlayer insulating film 140 is further formed to cover the common source line 160, and the plurality of bit lines 150 extending in the X direction are formed on the interlayer insulating film 140. For example, the bit line 150 includes a conductive material such as metal, and each bit line 150 is patterned so as to extend right above the channel stack 120 in parallel with the plurality of channel stacks 120. At the position of the end of each bit line 150, as shown in FIG. 5 and FIG. 7, an interlayer insulating film 140, an insulator stack 190, and a contact hole 152 extending from the uppermost interlayer dielectric 124A of the channel stack 120 to the lowermost interlayer dielectric 124B are formed. A conductive plug 154 is filled in each contact hole 152. Therefore, each bit line 150 is electrically connected to one end of one side of the channel stack 120 from the uppermost polysilicon layer 122A to the lowermost polysilicon layer 122B via each conductive plug 154.

One or more vertical gates 130 adjacent to the contact hole 152 beside the bit line constitute the selection gate line of one or more bit line side selection transistors of the NAND string, one or more vertical gates 130 adjacent to the common source line 160 constitute the selection gate line of one or more source line side selection transistors of the NAND string, and a plurality of vertical gates 130 other than those described constitute the word lines of a plurality of memory cells.

In NAND flash memory, read operations or programming operations are performed in units of pages, and erasing is performed in units of blocks. One polysilicon layer 122 of one channel stack 120 in the X direction corresponds to one NAND string. Therefore, a number of NAND strings corresponding to the number of stacks of the polysilicon layer 122 are formed in one channel stack 120. Moreover, the selection of one NAND string is performed by selective driving of a plurality of bit line side selection transistors. The selection of the page or the selection of the block is well known, so the detailed description is omitted herein.

Figure 8A:
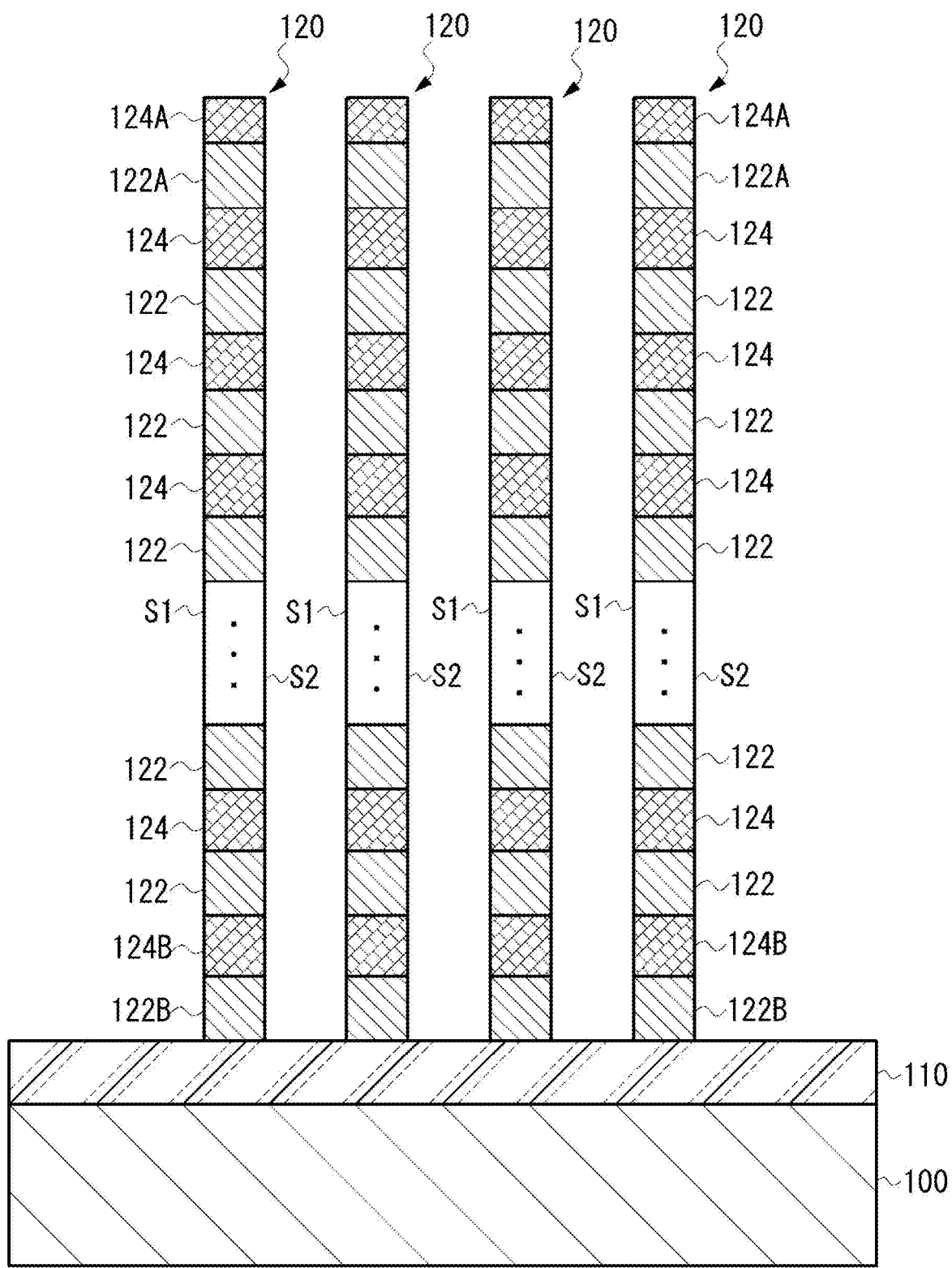
FIG. 8A to FIG. 8C are views illustrating the manufacturing steps of a NAND flash memory with a three-dimensional structure according to an embodiment of the disclosure.
Figure 8B:
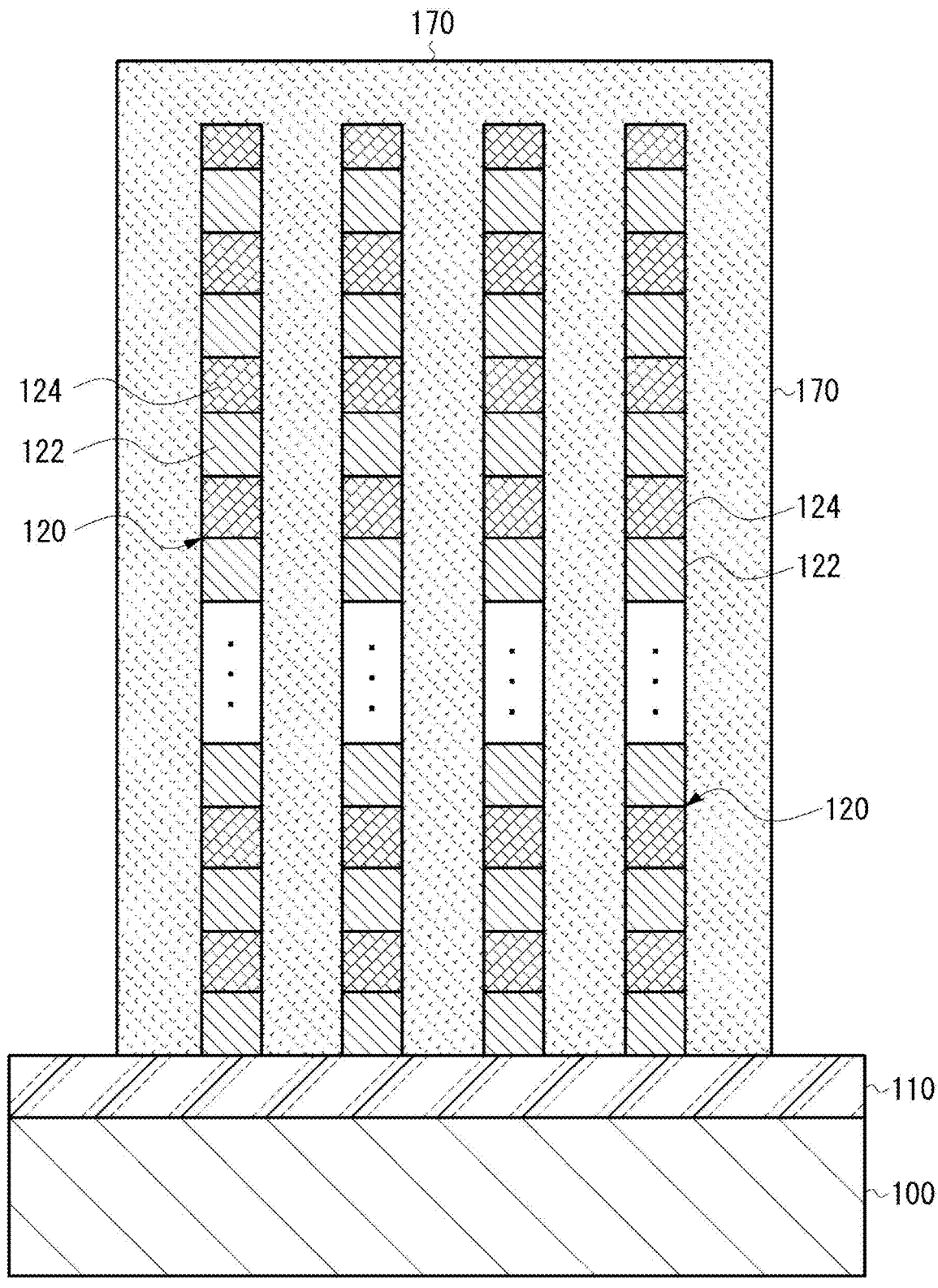
Figure 8C:
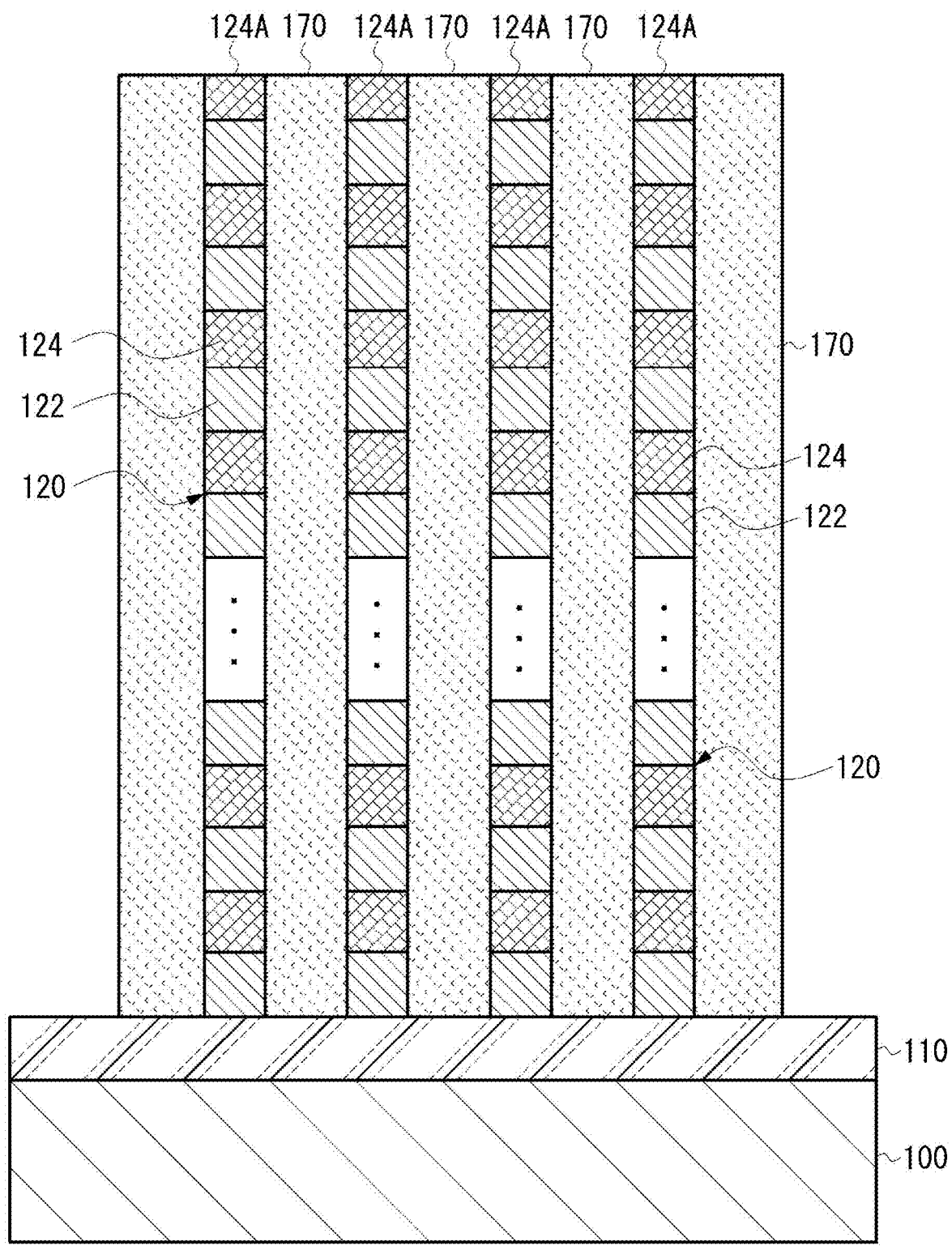

Next, the manufacturing method of the NAND flash memory with the three-dimensional structure of the embodiment is illustrated. FIG. 8A to FIG. 8C illustrate manufacturing steps corresponding to the cross section taken along line A1-A1 of FIG. 5. As shown in FIG. 8A, the lower interlayer dielectric 110 is formed on the silicon substrate 100, and a pre-channel stack in which the polysilicon layer 122 and the interlayer dielectric 124 are stacked alternately is formed on the lower interlayer dielectric 110. Then, the pre-channel stack is patterned by anisotropic etching to form a plurality of thin plate-shaped or fin-shaped channel stacks 120. The first side S1 and the second side S2 of each channel stack 120 extend along the X direction.

Then, as shown in FIG. 8B, the interlayer dielectric 170 is fully deposited by filling between the channel stacks 120. The material or deposition method of the interlayer dielectric 170 is not particularly limited, and a material or method with excellent step coverage, such as a step coverage that can cover the step difference of the channel stack 120, is selected.

Then, as shown in FIG. 8C, the interlayer dielectric 170 is etched until the uppermost interlayer dielectric 124A of the channel stack 120 is exposed. The etching step may also include planarization of the interlayer dielectric 124A and the interlayer dielectric 170.

Figure 9A:
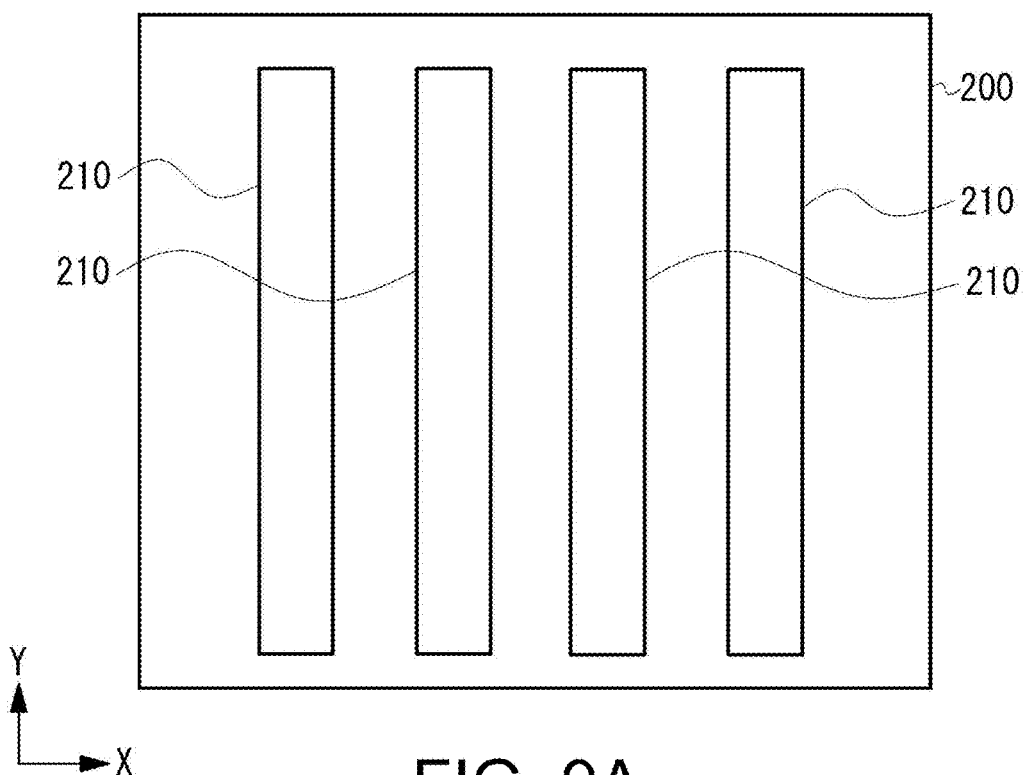
FIG. 9A is a plan view of a mask for forming trenches.
Figure 9B:
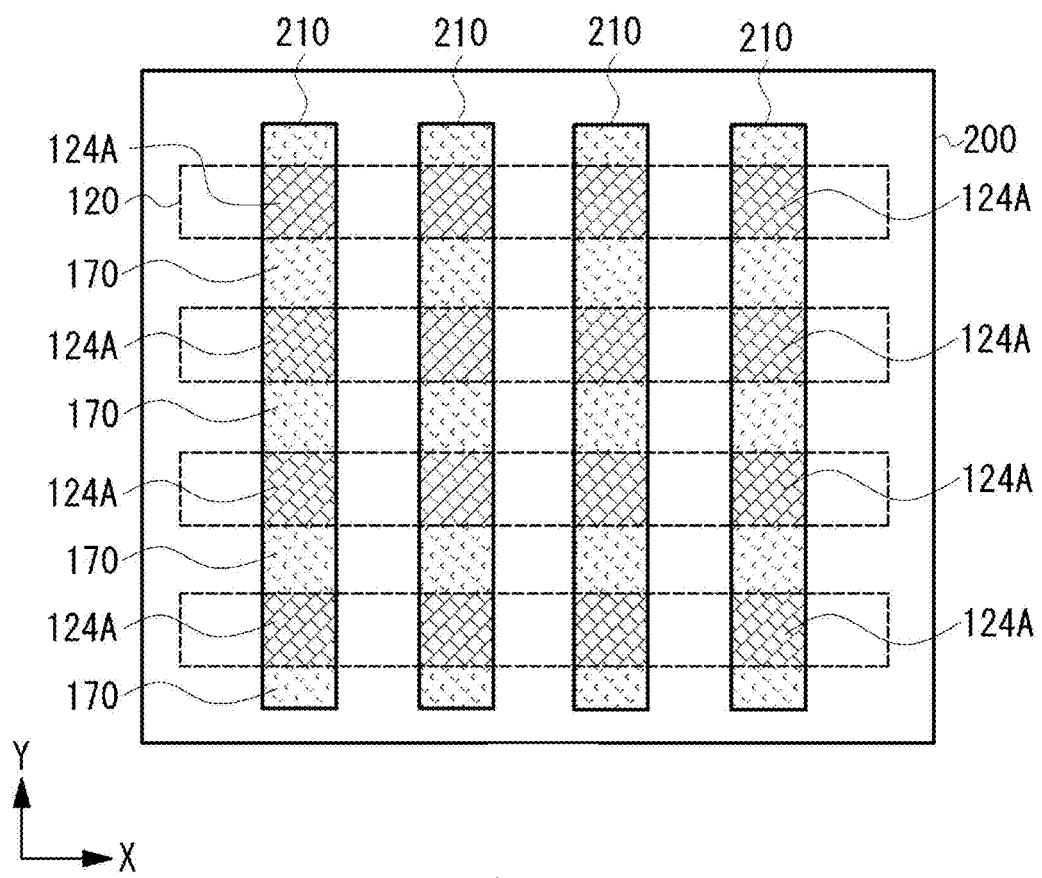
FIG. 9B is a plan view when a mask is formed on the channel stack.

The subsequent steps are illustrated with reference to FIG. 9A to FIG. 12B. FIG. 9A is a plan view of an etching mask for forming trenches in the interlayer dielectric 170. An etching mask 200 has a plurality of openings 210 formed at a fixed interval along the X direction, and each opening 210 extends along the Y direction. FIG. 9B is a plan view when the etching mask 200 is formed after the step of FIG. 8C.

When the etching pattern 200 is formed on the upper surface of the channel stack 120 and the interlayer dielectric 170, an opening 210 extending along the Y direction, as shown in the drawing, exposes the interlayer dielectric 170 between the interlayer dielectric 124A and the interlayer dielectric 124A of each channel stack 120. The opening 210 positions the trench 180 formed in the interlayer dielectric 170.

Then, anisotropic etching is performed through the etching mask 200. Meanwhile, to allow the interlayer dielectric 124A of the channel stack 120 to also function as an etching mask, an etchant with a large etching selection ratio of the interlayer dielectric 170 and the interlayer dielectric 124A is used. The etching proceeds until the lower interlayer dielectric 110 is exposed. Through this etching, a part of the interlayer dielectric 170 exposed through the opening 210 is removed, and the trench 180 is formed therein. Moreover, the etching mask 200 is not necessarily limited to the structure shown in FIG. 9A and FIG. 9B. For example, it may also be an etching mask in which a rectangular opening is formed two-dimensionally such that the interlayer dielectric 124A of the channel stack 120 is not exposed. In this case, the etching selection ratio of the interlayer dielectric 170 and the interlayer dielectric 124A may not necessarily be large.

Figure 10A:
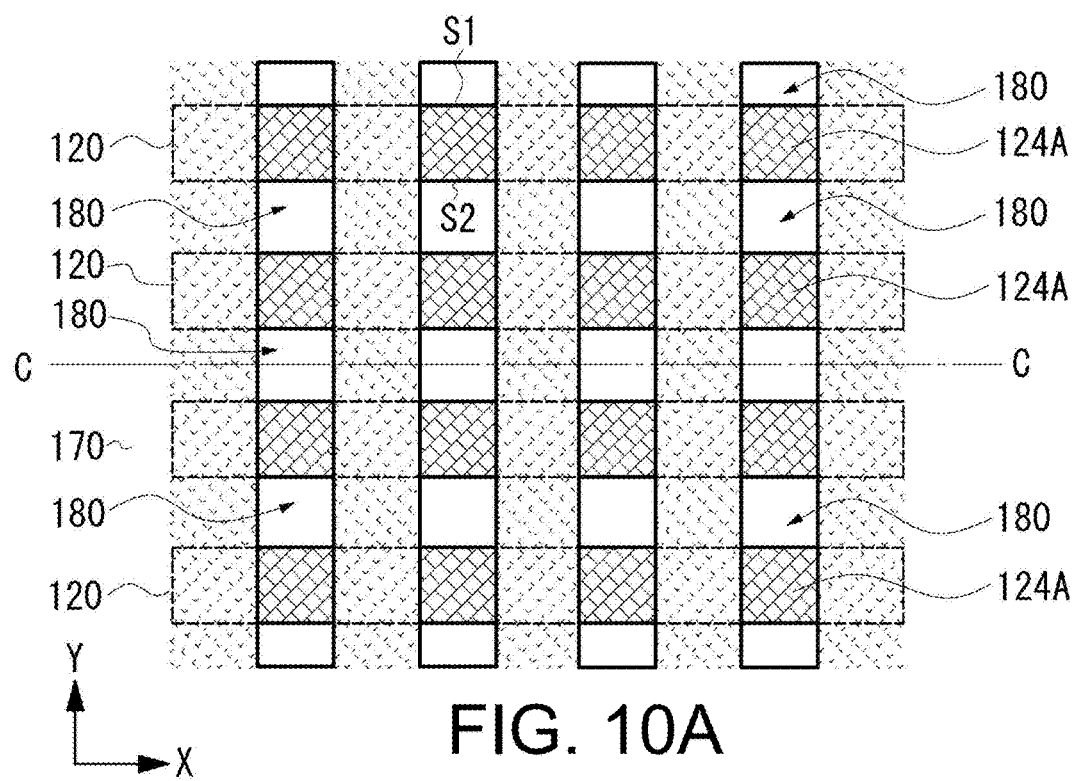
FIG. 10A is a plan view when trenches are formed.
Figure 10B:
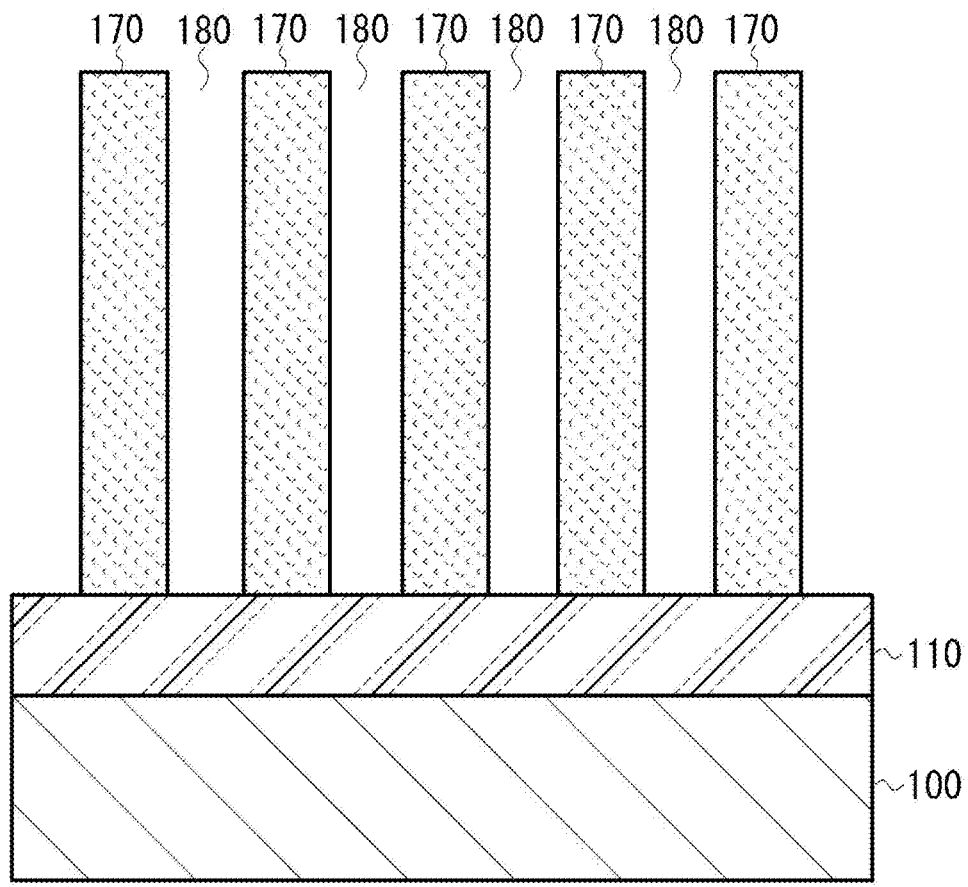
FIG. 10B is a C-C line cross-sectional view thereof.

FIG. 10A is a plan view after the etching mask 200 is removed, and FIG. 10B is a C-C line cross-sectional view thereof. As shown in the drawing, in the Y direction adjacent to the channel stack 120, the trench 180 that exposes the first side surface S1 and the second side surface S2 is formed. The inner space of the trench 180 is filled with the insulator stack 190 or the vertical gate 130 as illustrated in the subsequent paragraphs. The dimensions of the trench 180 in the X direction and the Y direction are appropriately selected corresponding to the pitch of the channel stack 120 in the Y direction.

Figure 11A:
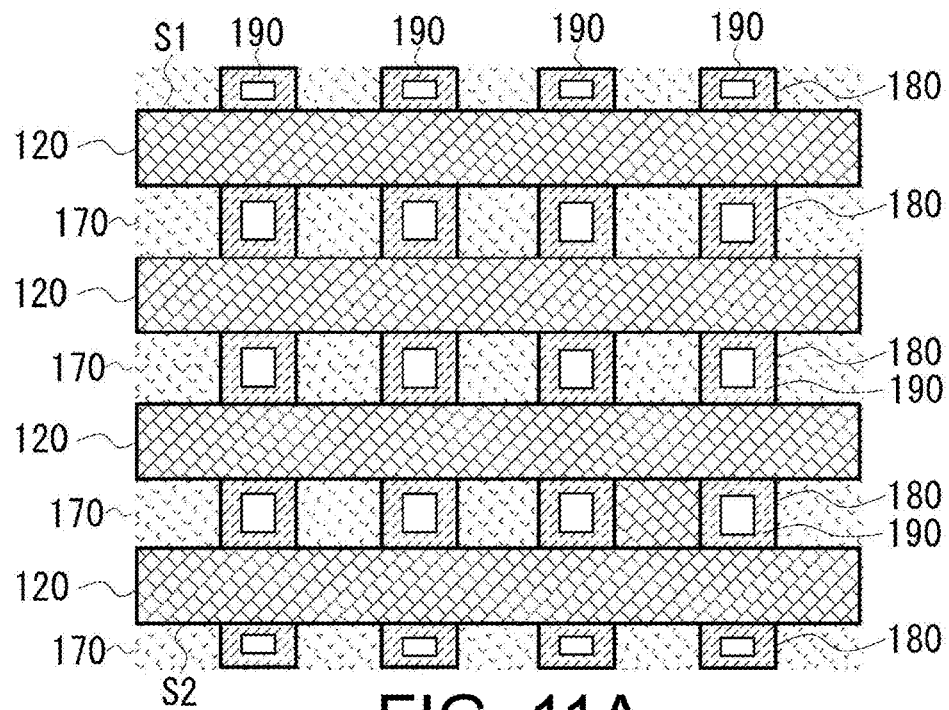
FIG. 11A is a plan view of the cross section taken along line D-D when the insulator stack including the charge storage layer has been formed.
Figure 11B:
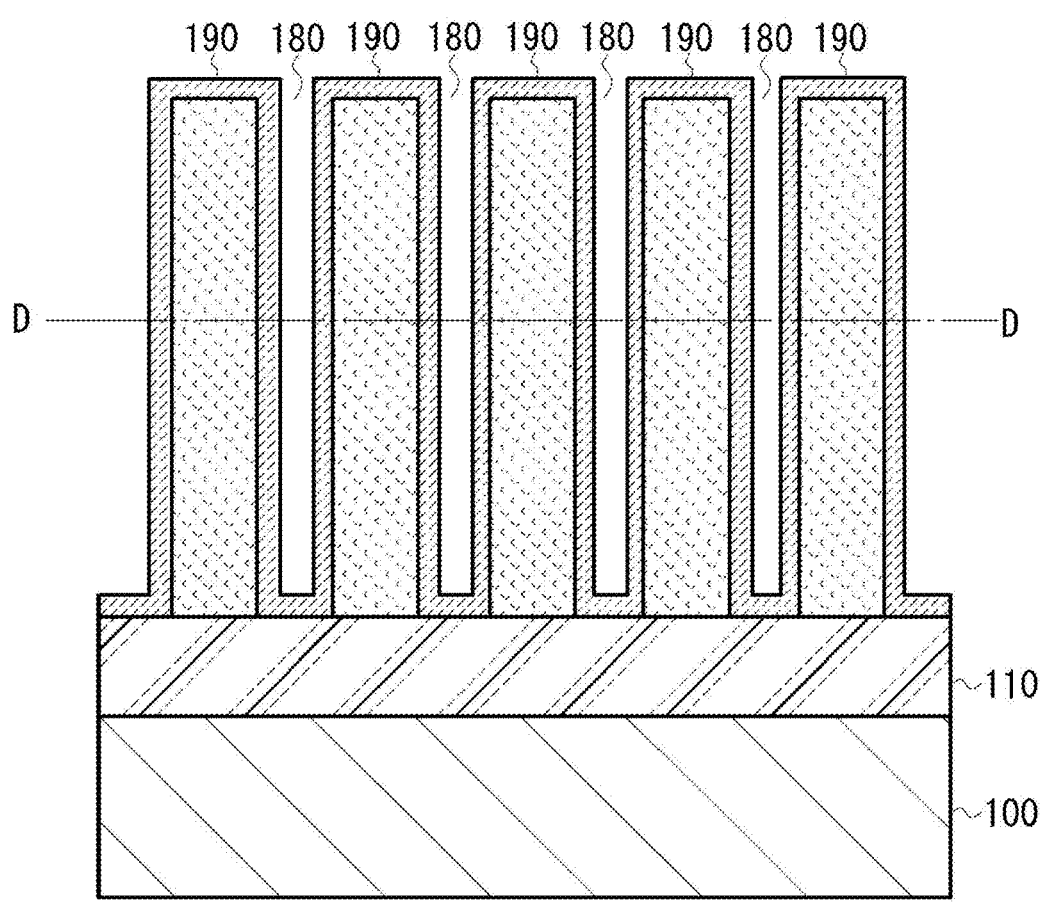
FIG. 11B is the cross-sectional view corresponding to line C-C.

Then, at least three or more insulator stacks 190 including the charge storage layer are deposited on the entire surface of the substrate including the trench 180. FIG. 11A is a plan view of the cross section taken along line D-D of FIG. 11B, and FIG. 11B is a cross-sectional view corresponding to line C-C of FIG. 10A. The insulator stack 190 is formed on the entire surface of the substrate so as to cover the bottom and sides of the trench 180. The film thickness of the insulator stack 190 is appropriately selected, and the vertical gate 130 is formed in space left after the insulator stack 190 is formed. Moreover, the insulator stack 190 only needs to be formed at least in the trench 180, and if it is not required, the insulator stack on the interlayer dielectric 170 can also be removed.

Figure 12A:
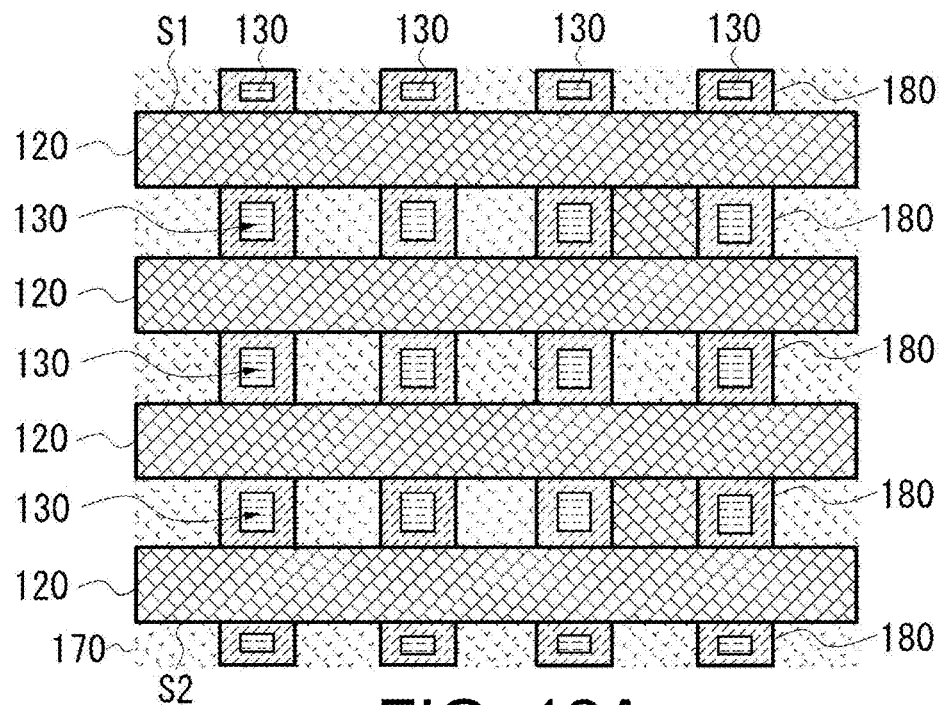
FIG. 12A is a plan view of cross section taken along line D-D when the gate material has been deposited.
Figure 12B:
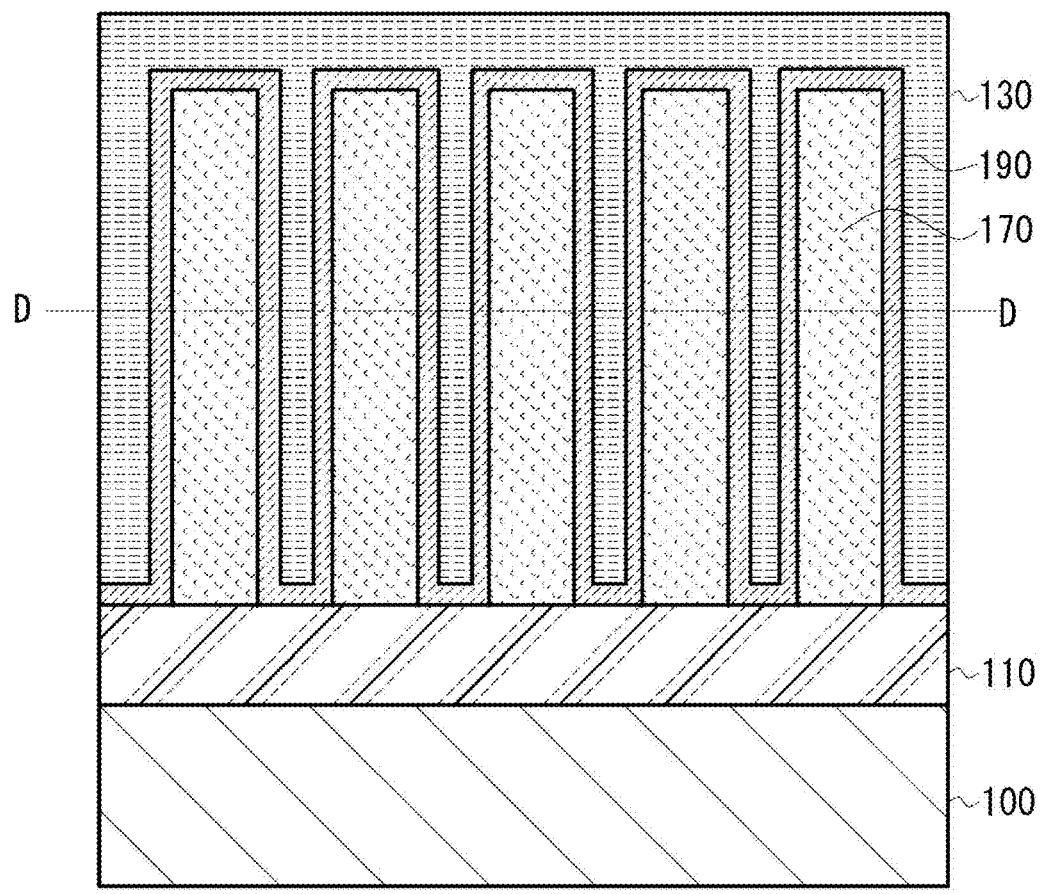
FIG. 12B is a cross-sectional view corresponding to line C-C.

Then, a low-resistance gate material (e.g., conductive polysilicon) is formed on the entire surface of the substrate including the trench 180, then the gate material is patterned so as to extend on the trench 180 in the Y direction, and therefore the vertical gate 130 is formed. FIG. 12A is a plan view of the cross section taken along line D-D of FIG. 12B, and FIG. 12B is a cross sectional view corresponding to line C-C of FIG. 10A. The vertical gate 130 extends in the vertical direction in the trench 180 and is surrounded by the insulator stack 190. One side surface of the vertical gate 130 separated from the insulator stack 190 is opposite to the first side S1 of the channel stack 120, and another side surface is opposite to the second side S2 of the adjacent channel stack 120.

After the vertical gate 130 is formed, the interlayer insulating film 140 is formed. Then, after the contact hole 162 is formed, the conductive plug 164 is formed in the contact hole 162, and then a common source line 160 connected to the conductive plug 164 is formed. Then, the interlayer insulating film 140 is formed so as to cover the common source line 160. Then, after the contact hole 152 is formed, the conductive plug 154 is formed in the contact hole 152, and thereafter, the bit line 150 connected to the conductive plug 154 is formed. Accordingly, the manufacturing process of the memory cell array is completed.

Accordingly, according to the embodiment, the trench for forming the vertical gate is formed in advance, and the vertical gate is formed in the trench. Therefore, there is no need to pattern and etch the vertical gate opposite to the side surface of the channel stack. The machining accuracy of the vertical gate can be improved. Furthermore, by forming an insulator stack in the trench, the vertical gate is surrounded by the insulator stack in the trench, so that it is possible to prevent a short circuit of adjacent vertical gates in the X direction and the Y direction.

Moreover, in the described embodiment, the bit line 150 and the common source line 160 are formed after the channel stack 120 is formed, but the disclosure is not limited thereto. Alternatively, it is possible to embed the bit line 150 and the common source line 160 in the lower insulating layer 110 before forming the channel stack 120. In this case, the conductive plug 154 for electrically connected to the bit line 150 and one end of one side of the polysilicon layer of the channel stack 120 and the conductive plug 164 for electrically connected to the common source line 160 and one end of another side of the polysilicon layer of the channel stack 120 are filled in the contact hole 152 and the contact hole 162 of the interlayer insulating film 140.

Moreover, the memory cell can be a single layer cell (SLC) type that stores one bit (binary data), or a type that stores multiple bits.

The preferred embodiments of the disclosure have been illustrated in detail, but the disclosure is not limited to specific embodiments, and various modifications and changes can be made within the scope of the objective of the disclosure described in the scope of the disclosure application.

What is claimed is:
1. A NAND flash memory, comprising:
a substrate;
a plurality of channel stacks formed on the substrate, wherein the channel stacks comprise a first side surface and a second side surface opposite to the first side surface, and the first side surface and the second side surface extend along a first direction;
an interlayer dielectric formed between the first side surface and the second side surface of each adjacent channel stack;
a plurality of trenches formed at a fixed pitch in the first direction of the interlayer dielectric;
an insulator comprising a charge storage layer formed so as to cover at least sidewalls of each trench, wherein the insulator covers the substrate and the interlayer dielectric; and
a plurality of gates extending along a second direction so as to fill a space in each trench in the second direction orthogonal to the first direction, wherein the insulator is located between the interlayer dielectric and the gates, and the insulator covers top surfaces of the channel stacks.

2. The NAND flash memory according to claim 1, wherein the gates extend from the substrate in a vertical direction in the trenches and are surrounded by the insulator.

3. The NAND flash memory according to claim 1, wherein the gates are in the trenches and are separated from the insulator to cover the first side surface and the second side surface of adjacent channel stacks of the plurality of channel stacks.

4. The NAND flash memory according to claim 2, wherein the gates are in the trenches and are separated from the insulator to cover the first side surface and the second side surface of adjacent channel stacks of the plurality of channel stacks.

5. The NAND flash memory according to claim 1, wherein the trenches expose the first side surface and the second side surface of the channel stacks at least from an uppermost channel layer to a lowermost channel layer.

6. The NAND flash memory according to claim 1, wherein the NAND flash memory further comprises a bit line electrically connected to one end of one side of each channel layer of a channel stack of the plurality of channel stacks.

7. The NAND flash memory according to claim 6, wherein the bit line is connected to a first conductive plug in a contact hole from an uppermost channel layer to a lowermost channel layer formed on one end of one side of the channel stack.

8. The NAND flash memory according to claim 1, wherein the NAND flash memory further comprises a source line electrically connected to one end of another side of each channel layer of a channel stack of the plurality of channel stacks.

9. The NAND flash memory according to claim 8, wherein the source line is connected to a second conductive plug in a contact hole from an uppermost channel layer to a lowermost channel layer formed on one end of another side of the channel stack.

* * * * *